United States Patent
Guo et al.

(10) Patent No.: US 9,601,921 B2
(45) Date of Patent: Mar. 21, 2017

(54) TIE-OFF CIRCUIT WITH OUTPUT NODE ISOLATION FOR PROTECTION FROM ELECTROSTATIC DISCHARGE (ESD) DAMAGE

(71) Applicant: International Business Machines Corporation, Armonk, NY (US)

(72) Inventors: Chen Guo, San Jose, CA (US); Yutaka Nakamura, Kyoto (JP); Jun Sawada, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 500 days.

(21) Appl. No.: 14/142,607

(22) Filed: Dec. 27, 2013

(65) Prior Publication Data
US 2015/0188313 A1    Jul. 2, 2015

(51) Int. Cl.
*H02H 9/04* (2006.01)
*H03K 3/353* (2006.01)
*H01L 27/088* (2006.01)

(52) U.S. Cl.
CPC ............ *H02H 9/046* (2013.01); *H03K 3/353* (2013.01); *H01L 27/088* (2013.01)

(58) Field of Classification Search
CPC ....... H02H 9/046; H03K 3/353; H01L 27/088
See application file for complete search history.

(56) References Cited

U.S. PATENT DOCUMENTS

| | | | |
|---|---|---|---|
| 5,436,578 A * | 7/1995 | Brown | H01L 27/11898 257/E27.11 |
| 5,644,460 A | 7/1997 | Clukey | |
| 5,907,464 A | 5/1999 | Maloney et al. | |
| 6,396,306 B2 | 5/2002 | Dring et al. | |
| 6,521,952 B1 * | 2/2003 | Ker | H01L 27/0262 257/141 |
| 6,995,598 B2 * | 2/2006 | Hochschild | H03K 3/356113 326/81 |
| 7,221,183 B2 | 5/2007 | Chen | |
| 7,672,101 B2 | 3/2010 | Lin et al. | |
| 7,768,308 B2 | 8/2010 | Maede et al. | |
| 2002/0005595 A1 * | 1/2002 | Dring | H03K 3/356008 327/326 |
| 2006/0268474 A1 * | 11/2006 | Huang | H01L 27/0251 361/56 |
| 2011/0063763 A1 * | 3/2011 | Alvarez | H01L 27/0281 361/56 |
| 2014/0167099 A1 * | 6/2014 | Mergens | H01L 29/87 257/109 |

* cited by examiner

*Primary Examiner* — Zeev V Kitov
(74) *Attorney, Agent, or Firm* — Sherman IP LLP; Kenneth L. Sherman; Steven Laut

(57) ABSTRACT

Embodiments relate to electrostatic discharge (ESD) protection. One embodiment includes a tie-off circuit including a multiple field effect transistors (FETs), a first internal node, a second internal node, a first output node and a second output node. A node isolation circuit is connected to the first output node and the second output node of the tie-off circuit. The node isolation circuit includes a first FET with a third output node and a second FET with a fourth output node. The third output node and the fourth output node are electrically isolated from the first internal node and the second internal node.

20 Claims, 6 Drawing Sheets

TIE-OFF CIRCUIT WITH OUTPUT NODE ISOLATION FOR PROTECTION FROM ELECTROSTATIC DISCHARGE (ESD) DAMAGE

GOVERNMENT RIGHTS

This invention was made with United States Government support under HR0011-09-C-0002 awarded by Defense Advanced Research Projects Agency (DARPA). The government has certain rights in this invention.

BACKGROUND

Embodiments of the invention relate to electrostatic discharge (ESD) protection, and in particular, a tie-off circuit with output node isolation for protection from ESD.

ESD events may create extremely high voltages/currents that have the potential to destroy integrated circuits (ICs) by driving current into (or drawing current from) the decoupling/parasitic capacitance in the IC chip. ESD protection structures are used to protect Field Effect Transistor (FET) gate oxide and source/drain diffusions that are directly connected to a pad in the Input/Output (I/O) circuits by absorbing/shunting the majority of the ESD pulse.

Technology scaling has enabled performance improvement, density increase and energy reduction, but it has also resulted in degradation of device ESD tolerance. The FET gate oxide breakdown voltage has been steadily decreasing due to reduction in oxide thickness, and the FET source/drain diffusion breakdown voltage has also been decreasing due to higher substrate doping density. Although I/O circuits may use slightly thicker FET gate oxide and lower substrate doping density to mitigate this ESD tolerance degradation, internal circuits use increasingly thinner gate oxide and higher substrate doping density to reap the benefits of technology scaling. Both the FET gate oxide and source/drain diffusion breakdown voltage of internal circuits have decreased.

BRIEF SUMMARY

Embodiments of the invention relate to electrostatic discharge (ESD) protection. One embodiment includes a tie-off circuit including a multiple field effect transistors (FETs), a first internal node, a second internal node, a first output node and a second output node. A node isolation circuit is connected to the first output node and the second output node of the tie-off circuit. The node isolation circuit includes a first FET with a third output node and a second FET with a fourth output node. The third output node and the fourth output node are electrically isolated from the first internal node and the second internal node.

One embodiment comprises an ESD device. In one embodiment, a node isolation circuit is coupled to a first output node and a second output node of a tie-off circuit. In one embodiment, the node isolation circuit including a first FET with a third output node and a second FET with a fourth output node. In one embodiment, the third output node and the fourth output node are electrically isolated from internal nodes of the tie-off circuit.

Another embodiment comprises a system. In one embodiment, the system includes a node isolation circuit coupled to a first output node and a second output node of a tie-off circuit. In one embodiment, the node isolation circuit including a first FET with a third output node and a second FET with a fourth output node. In one embodiment, an integrated circuit is coupled to the node isolation circuit. In one embodiment, the third output node and the fourth output node are electrically isolated from internal nodes of the tie-off circuit, and the node isolation circuit coupled to the tie-off circuit provides protection from ESD for the integrated circuit.

These and other features, aspects and advantages of the present invention will become understood with reference to the following description, appended claims and accompanying figures.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

Embodiments of the invention relate to electrostatic discharge (ESD) protection. One or more embodiments improve upon conventional tie-off circuits by using one or two additional FETs to electrically isolate the internal HI or/and LO signals from the loaded outputs. In one embodiment, the additional FETs provides additional stability over conventional tie-off circuits by allowing the circuit's internal nodes to stabilize quickly even if the outputs are heavily/asymmetrical loaded or heavily coupled. In one example embodiment, compared to adding inverters to the conventional design for added stability and drive strength, which would require adding four additional FETs, the one or more embodiments achieves the same using only one or two additional FETs, thus reducing the additional silicon area necessary by half.

In one embodiment, a modified tie-off circuit incorporates additional cascaded stages to provide additional immunity against heavy/asymmetrical loads. In instances where the tie-off circuit drives long connecting wires, one embodiment provides a variation by inserting the modified tie-off embodiment inserted at regular intervals along the connecting wire to mitigate capacitance coupling. In one or more embodiments, the benefits are achieved using half as many FETs as if inverters were used to achieve the same.

Figure 1:
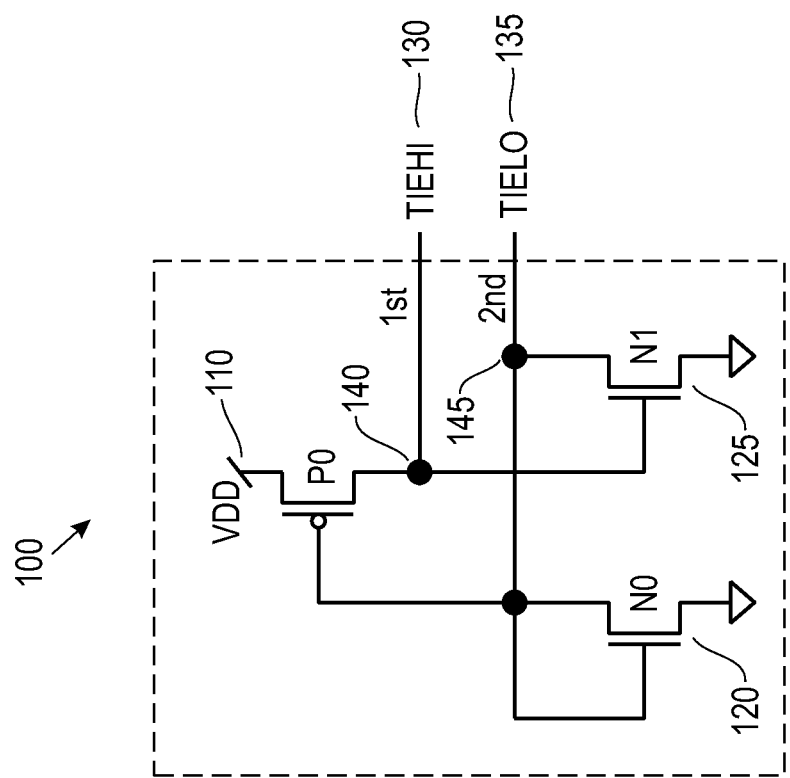
FIG. 1 illustrates a schematic diagram of a tie-off circuit.

FIG. 1 illustrates a schematic view of a tie-off circuit 100. Tie-off circuit 100 includes three FETs consisting of a positive channel FET (PFET) P0 110 and two negative channel FETs (NFETs) N0 120 and N1 125. The hi node 140 is tied to TIEHI 130 and the lo node 145 is tied to TIELO 135. In the worst case, the circuit 100 is initialized with TIEHI 130 node low (ground, (GND)) and TIELO 135 node high (power, voltage drain, drain (VDD)). In that event, both P0 110 and N1 125 are initially "off," but N0 120 turns on to bring its drain voltage (TIELO 135) down from VDD to Vt (Threshold Voltage). This weakly turns on P0 110, causing P0 110 to pull up the gate of N1 125 (TIEHI 130), which in turn causes N1 125 to turn "on" and pull its drain voltage (TIELO 135) to GND. This consequently turns P0 110 on fully and establishes regenerative feedback in which P0 110 pulls up TIEHI 130 to keep N1 125 on, while N1 125 pulls down TIELO 135 to keep P0 110 on. In this state, N0 120 is off and only turns on if TIELO 135 becomes momentarily high or unstable. In this conventional circuit 100, TIEHI 130 and TIELO 135 are simultaneously internal nodes and outputs, so any heavy/asymmetrical loading or heavy coupling may cause slow stabilization of the circuit nodes or instability. That is, for the conventional tie-off circuit 100, the internal hi-node 140 and the output node TIEHI 130 are electrically coupled forming a first single node, and the internal lo-node node 145 and the output node TIELO 135 are electrically coupled forming a second single node.

Even with the use of ESD protection structures, such as circuit 100, any remaining high ESD currents/voltages propagate through the power/ground supply grid and may potentially damage any devices connected into the power/ground grid. While IC devices typically have drains/sources tied to the supply grid, tying a device's gate directly to power/ground is especially risky, since an FET's gate oxide breakdown voltage is roughly half of its source/drain breakdown voltage. Therefore, a tie-off circuit 100 is necessary to provide logical HI and logical LO voltage levels that may be used in place of power/ground to safely tie-off the gates of devices. In the conventional tie-off circuit 100, P0 110, N0 120 and N1 125 are used to provide stable logical HI and logical LO levels using regenerative feedback, with no gates directly connected to power/ground. This configuration offers added ESD protection with minimal silicon area requirement (only 3 FETs), but the outputs may take a long time to stabilize if heavily loaded. Additionally, the outputs may become unstable if the HI and LO outputs are asymmetrically loaded or heavily coupled.

Figure 2:
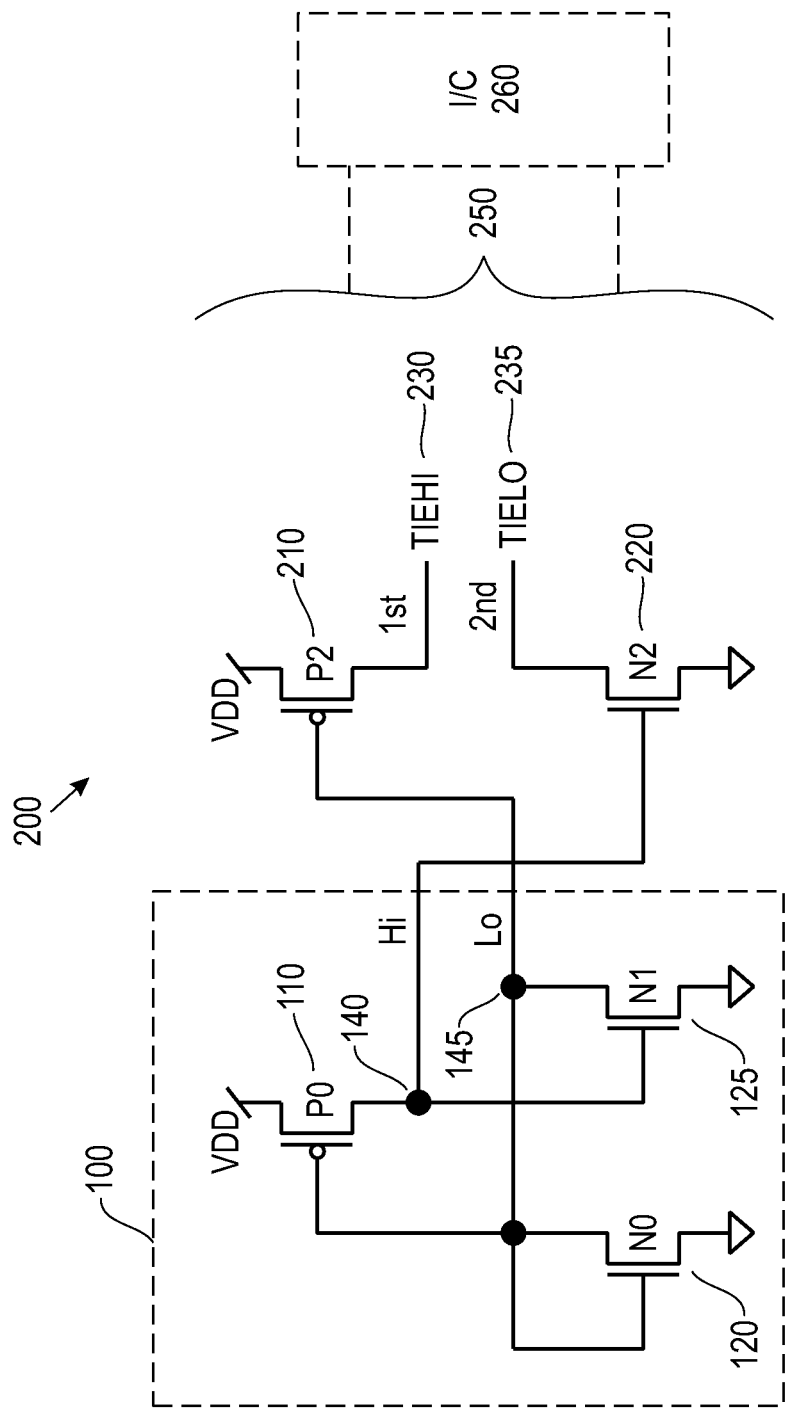
FIG. 2 illustrates a schematic diagram of a tie-off circuit according to one embodiment.

FIG. 2 illustrates a schematic diagram of a tie-off circuit 200 according to one embodiment. In one embodiment, a stage 250 comprising two FETs including a PFET (P2 210) and NFET (N2 220) are added to the circuit 100 to isolate the internal nodes (hi 140 and lo 145) from the outputs (which in circuit 200 are TIEHI 230 and TIELO 235). In one embodiment, the node 145 is connected to the gate of P2 210, which generates the output TIEHI 230, while the hi node 140 is connected to the gate of N2 220, which generates the output TIELO 235. In one or more embodiments, since the outputs are electrically isolated from the internal feedback nodes by the addition of FETs P2 210 and N2 220, heavy/asymmetrical loading or heavily coupled outputs will not prevent fast stabilization or jeopardize the stability of the internal nodes.

In one embodiment, the output of TIEHI 230 is connected to a first input of an integrated circuit (IC) 260 and the output of TIELO 235 is connected to a second input of the IC 260. In one embodiment, the IC 260 may comprise any type of IC for which protection from ESD is desired (e.g., an application specific IC (ASIC), memory device, processor, etc.). In one embodiment, the inputs of the IC 260 may comprise pads in an I/O circuit connected to the IC 260, where the circuit 200 provides ESD protection by absorbing/shunting the majority of an ESD pulse.

Figure 3:
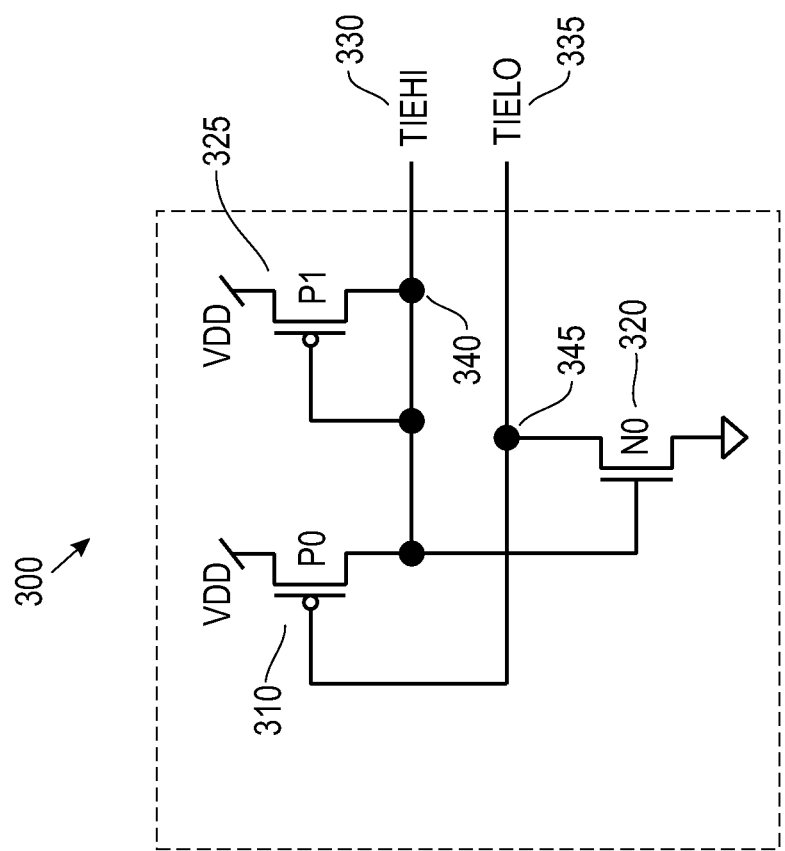
FIG. 3 illustrates a schematic diagram of another tie-off circuit.

FIG. 3 illustrates a schematic diagram of another conventional tie-off circuit 300. Tie-off circuit 300 is an alternative configuration for the conventional tie-off circuit 100 (FIG. 1). Tie-off circuit 300 is configured using two PFETs (P0 310 and P1 325) and one NFET (N0 320). In circuit 300, P0 310 and N0 320 offer regenerative feedback to keep TIEHI 330 at VDD and TIELO 335 at GND, using the same principles as with circuit 100. P1 325 is turned off in typical operation and only turns on in the event that TIEHI 330 becomes low or unstable, in which case P1 325 turns on to re-establish the desired output voltages.

Figure 4:
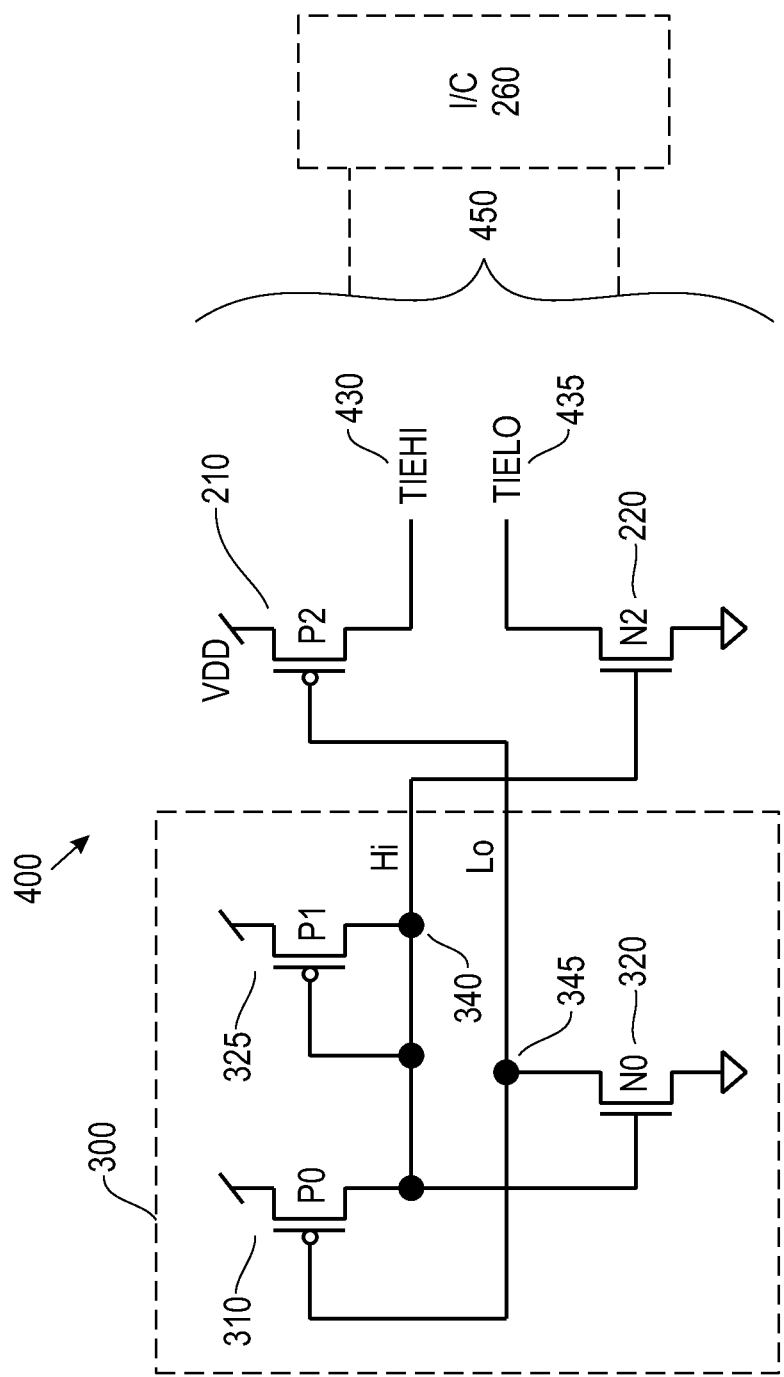
FIG. 4 illustrates a schematic diagram of another tie-off circuit according to one embodiment.

FIG. 4 illustrates a schematic diagram of another tie-off circuit 400 according to one embodiment. In this embodiment, circuit 400 includes a stage 450 including the addition of two FETs (PFET P2 210 and NFET N2 220) to the outputs of the conventional circuit 300 for electrically isolating the internal nodes (hi 340 and lo 345) from the outputs (TIEHI 430 and TIELO 435). In one embodiment, the addition of P2 210 and N2 220 improves upon the conventional design of circuit 300 by making the circuit 400 more robust and less susceptible to slow stabilization or instability that may result from heavy/asymmetrical loading or heavy coupling.

The embodiments including circuits 200 and 400 provide added stability to the conventional tie-off circuits 100 (FIG. 1) and 300 (FIG. 3) by the additional two FETs in each circuit (stage 250 and stage 450), whereas simply adding inverters to the outputs of the conventional tie-off circuit (e.g., tie-off circuits 100 and 300) would require four (4) additional FETs and thus, twice as much additional silicon area.

In one embodiment, the output of TIEHI 430 is connected to a first input of an IC 260 and the output of TIELO 435 is connected to a second input of the IC 260. In one embodiment, the circuit 400 provides ESD protection for the IC 260. In one embodiment, the inputs of the IC 260 may comprises pads in an I/O circuit connected to the IC 260, where the circuit 400 provides ESD protection by absorbing/shunting the majority of an ESD pulse.

Figure 5:
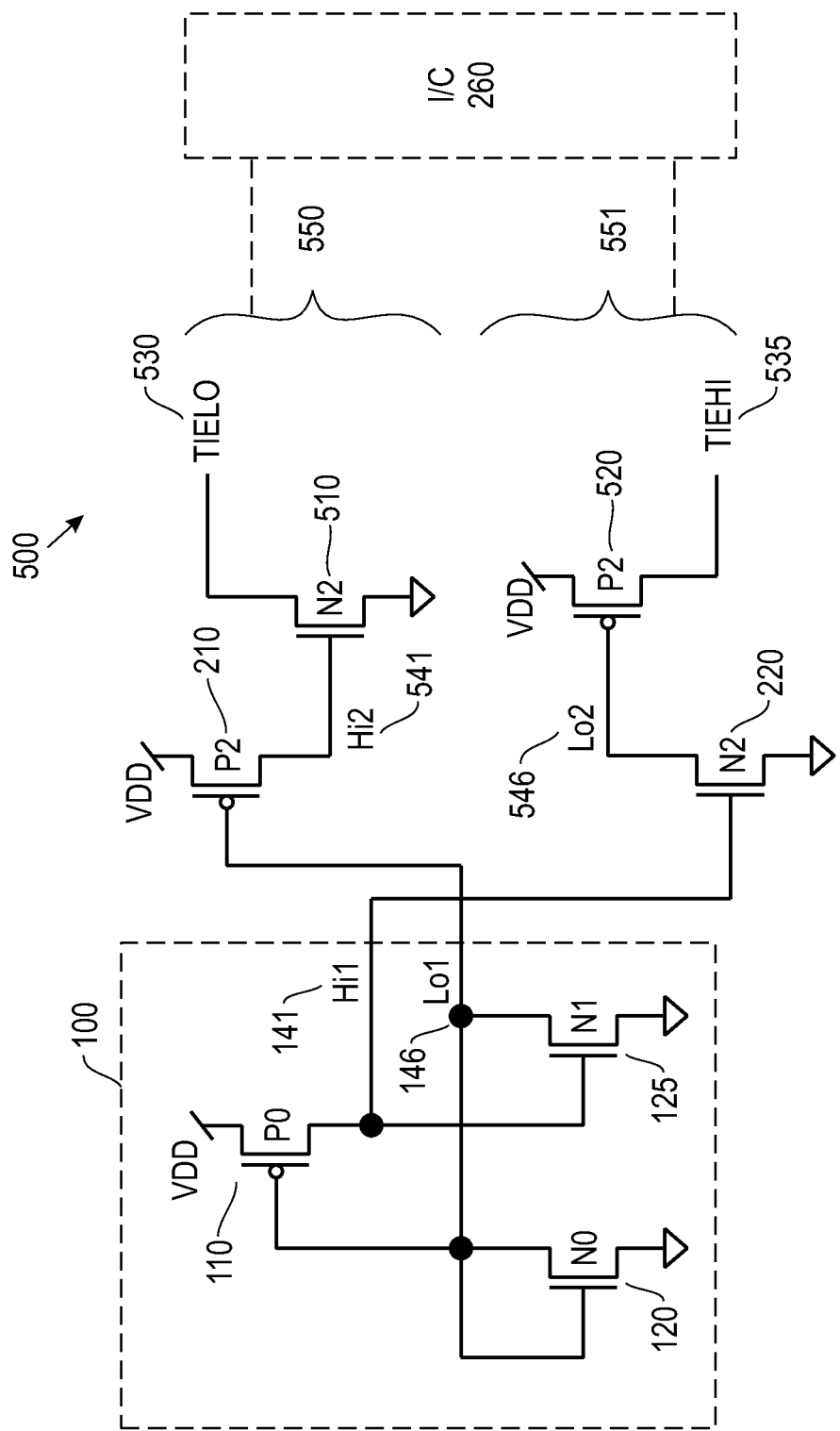
FIG. 5 illustrates a schematic diagram of a tie-off circuit including cascaded output stages according to one embodiment.

FIG. 5 illustrates a schematic diagram of a tie-off circuit 500 including cascaded output stages 550 and 551 according to one embodiment. In the event that the tie-off circuit (e.g., circuit 100 (FIG. 1) or 300 (FIG. 3)) load is extremely heavy or asymmetrical, adding one stage (e.g., stage 250, FIG. 2, or stage 450, FIG. 4) to the conventional tie-off circuit may not be sufficient to maintain circuit stability. In that case, in one embodiment additional cascaded stage 550 (with hi2 node 541) and stage 551 (with lo2 node 546) may be added to the outputs of circuits 200 (FIG. 2) and 400 (FIG. 4) to provide additional drive strength and added electrical isolation of the internal feedback nodes (e.g., hi1 141 and lo1 146).

In one embodiment, the output of TIELO 530 is connected to a first input of an IC 260 and the output of TIEHI 535 is connected to a second input of the IC 260. In one embodiment, the circuit 500 provides ESD protection for the IC 260. In one embodiment, the inputs of the IC 260 may comprise pads in an I/O circuit connected to the IC 260, where the circuit 500 provides ESD protection by absorbing/shunting the majority of an ESD pulse.

In one embodiment, the tie-off circuit 500 with two cascaded output stages 550 and 551 is shown as an example embodiment, but other embodiments may include additional cascaded output stages as necessary to drive the output load with sufficient strength and stability. In one or more embodiments, the stages 550 and 551 add only two additional FETs (NFET N2 510 and PFET P2 520) per cascaded stage, compared to four FETs per stage if a designer added inverters to the outputs of the conventional tie-off circuit 100, thus reducing the additional silicon area needed by half. Since the states of the TIEHI 130 and TIELO 135 (FIG. 1) outputs of the conventional tie-off circuit 100 are known and reinforced by positive feedback, adding full inverters to the outputs to provide additional stability and drive strength would be inefficient, whereas the embodiments of the invention use minimum additional silicon area to achieve desired results.

Figure 6:
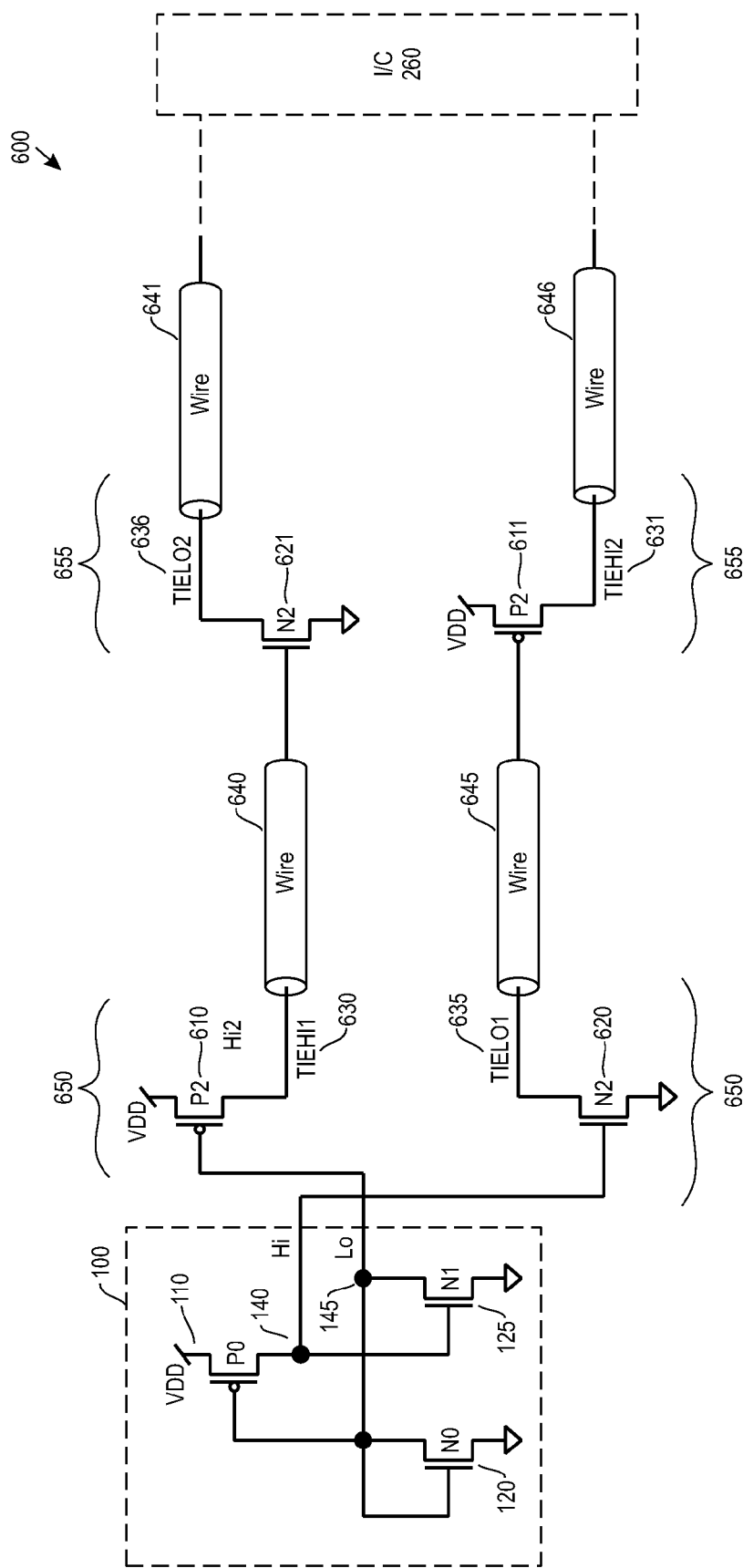
FIG. 6 illustrates a schematic diagram of a tie-off circuit including stages between wires according to one embodiment.

FIG. 6 illustrates a schematic diagram of a tie-off circuit 600 including stages 650 and 655 between connecting wires 640/641 and 645/646 according to one embodiment. In one embodiment, in the event that the tie-off circuit (e.g., tie-off circuit 100) is loaded by long (e.g., 1-5 mm) wires 640/641 and 645/646 that are heavily (e.g., 0.2-1 pF) capacitive coupled, 1 PFET P2 610 and 1 NFET N2 620 are inserted in stage 650, and 1 PFET P2 611 and 1 NFET N2 621 are inserted in stage 655, at regular intervals along the wires 640/641 and 645/646. In one embodiment, the output of TIELO1 635 is connected to the wire 645 and the output of TIEHI1 630 is connected to the wire 640, and the output of TIELO2 636 is connected to the wire 641 and the output of TIEHI2 631 is connected to the wire 646.

In one embodiment, the added FETs in stages 650 and 655 provide protection against capacitive coupling as well as improved current drive along the length of each wire 640/641 and 645/646, and require only two FETs per stage (e.g., P2 610 and N2 620 in stage 650, and P2 611 and N2 621 in stage 655). If inverters were used as repeaters along the length of the wire instead, four FETs per stage would be necessary, requiring twice as much silicon area as the embodiment of circuit 600. In one embodiment, the tie-off circuit 600 with two stages 650 and 655 inserted between the wires 640/641 and 645/646 is shown as an example embodiment, but other embodiments may include additional stages between additional wires as necessary to drive the output load with sufficient strength and stability.

In one embodiment, the connection wire 641 is connected to a first input of an IC 260 and the wire 646 is connected to a second input of the IC 260. In one embodiment, the circuit 600 provides ESD protection for the IC 260. In one embodiment, the inputs of the IC 260 may comprises pads in an I/O circuit connected to the IC 260, where the stages 650 and 655 coupled to the tie-off circuit 100 provides ESD protection by absorbing/shunting the majority of an ESD pulse.

It will be clear that the various features of the foregoing methodologies may be combined in any way, creating a plurality of combinations from the descriptions presented above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should be emphasized that the above-described embodiments of the present invention, particularly, any "preferred" embodiments, are merely possible examples of implementations, merely set forth for a clear understanding of the principles of the invention.

Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. An apparatus, comprising:
   a tie-off circuit including three field effect transistors (FETs), a first internal node, a second internal node, a first output node and a second output node; and
   a node isolation circuit coupled to the first output node and the second output node of the tie-off circuit, the node isolation circuit consisting of a first FET with a third output node and a second FET with a fourth output node,
   wherein:
   the second output node comprises a logical LO node and is coupled to a gate of the first FET and generates a TIE HI output, and the first output node comprises a logical HI node and is coupled to a gate of the second FET and generates a TIE LO output; and
   the third output node and the fourth output node are electrically isolated from the first internal node and the second internal node.

2. The apparatus of claim 1, wherein the first FET comprises a first positive channel FET (PFET) and the second FET comprises a first negative channel FET (NFET), and due to the third output node and the fourth output node being electrically isolated from the first internal node and the second internal node by the first PFET and the first NFET, the tie-off circuit is not loaded by loading elements.

3. The apparatus of claim 2, wherein the first NFET is coupled to the first output node and the first PFET is coupled to the second output node, and the first output node comprises a logical HI node and the second output node comprises a logical LO node.

4. The apparatus of claim 3, wherein for the tie-off circuit the first internal node and the first output node are electrically coupled forming a first single node, and the second internal node and the second output node are electrically coupled forming a second single node.

5. The apparatus of claim 4, wherein the two of the three FETs comprise NFETs or two of the three FETs comprise PFETs.

6. The apparatus of claim 5, wherein the first PFET generates output for the third output node and the first NFET generates output for the fourth output node, and the tie-off circuit coupled to the node isolation circuit provides protection from electrostatic discharge (ESD).

7. The apparatus of claim 5, wherein a first stage consisting of the first PFET and the first NFET is coupled to the second output node of the tie-off circuit, and the node isolation circuit further comprises a second stage consisting of a second PFET and a second NFET, and the second stage is coupled to the first output node of the tie-off circuit.

8. The apparatus of claim 5, wherein the first PFET and the first NFET comprise a first stage, the third output is coupled to a first connection wire and the fourth output is coupled to a second connection wire, and the node isolation circuit further comprises a second stage consisting of a second NFET with a fifth output and a second PFET with a sixth output, the second NFET is coupled to the first connection wire, the second PFET is coupled to the second connection wire, and the fifth output is coupled to a third connection wire and the sixth output is coupled to a fourth connection wire.

9. An electrostatic discharge (ESD) device, comprising:
a node isolation circuit coupled to a first output node and a second output node of a tie-off circuit, the node isolation circuit consisting of a first FET with a third output node and a second FET with a fourth output node,
wherein the second output node comprises a logical LO node and is coupled to a gate of the first FET and generates a TIE HI output, and the first output node comprises a logical HI node and is coupled to a gate of the second FET and generates a TIE LO output; and the third output node and the fourth output node are electrically isolated from internal nodes of the tie-off circuit.

10. The ESD device of claim 9, wherein the first FET comprises a first positive channel FET (PFET) and the second FET comprises a first negative channel FET (NFET), the first NFET is coupled to the first output node and the first PFET is coupled to the second output node.

11. The ESD device of claim 10, wherein for the tie-off circuit the first internal node and the first output node are electrically coupled forming a first single node, the second internal node and the second output node are electrically coupled forming a second single node, the tie-off circuit consisting of three FETs, and two of the three FETs comprise NFETs or two of the three FETs comprise PFETs.

12. The ESD device of claim 11, wherein the second output node is coupled to a gate of the first PFET and the first output node is coupled to a gate of the first NFET and the first PFET generates output for the third output node and the first NFET generates output for the fourth output node.

13. The ESD device of claim 11, wherein the first PFET and the first NFET comprise a first stage coupled to the second output node of the tie-off circuit, and the node isolation circuit further comprises a second stage consisting of a second PFET and a second NFET, and the second stage is coupled to the first output node of the tie-off circuit.

14. The ESD device of claim 11, wherein the first PFET and the first NFET comprise a first stage, the third output is coupled to a first connection wire and the fourth output is coupled to a second connection wire, the node isolation circuit further comprises a second stage consisting of a second NFET with a fifth output and a second PFET with a sixth output, the second NFET is coupled to the first connection wire, the second PFET is coupled to the second connection wire, and the fifth output is coupled to a third connection wire and the sixth output is coupled to a fourth connection wire.

15. A system comprising:
a node isolation circuit coupled to a first output node and a second output node of a tie-off circuit, the node isolation circuit consisting of a first FET with a third output node and a second FET with a fourth output node; and
an integrated circuit coupled to the node isolation circuit, wherein the second output node comprises a logical LO node and is coupled to a gate of the first FET and generates a TIE HI output, and the first output node comprises a logical HI node and is coupled to a gate of the second FET and generates a TIE LO output; the third output node and the fourth output node are electrically isolated from internal nodes of the tie-off circuit, and the node isolation circuit coupled to the tie-off circuit provides protection from electrostatic discharge (ESD) for the integrated circuit.

16. The system of claim 15, wherein the first FET comprises a first positive channel FET (PFET) and the second FET comprises a first negative channel FET (NFET), the first NFET is coupled to the first output node and the first PFET is coupled to the second output node, and the logical HI node and the logical LO node are coupled to input nodes of the integrated circuit.

17. The system of claim 16, wherein for the tie-off circuit the first internal node and the first output node are electrically coupled forming a first single node, the second internal node and the second output node are electrically coupled forming a second single node, the tie-off circuit consisting of three FETs, and two of the three FETs comprise NFETs or two of the three FETs comprise PFETs.

18. The system of claim 17, wherein the second output node is coupled to a gate of the first PFET and the first output node is coupled to a gate of the first NFET,-and the first PFET generates output for the third output node and the first NFET generates output for the fourth output node.

19. The system of claim 17, wherein the first PFET and the first NFET comprise a first stage coupled to the second output node of the tie-off circuit, the node isolation circuit further comprises a second stage consisting of a second PFET and a second NFET, the second stage is coupled to the first output node of the tie-off circuit, a first output from the first stage is coupled to a first input of the integrated circuit, and a second output from the second stage is coupled to a second input of the integrated circuit.

20. The system of claim 17, wherein the first PFET and the first NFET comprise a first stage, the third output is coupled to a first connection wire and the fourth output is coupled to a second connection wire, the node isolation circuit further comprises a second stage consisting of a second NFET with a fifth output and a second PFET with a sixth output, the second NFET is coupled to the first connection wire, the second PFET is coupled to the second connection wire, the fifth output is coupled to a third connection wire and the sixth output is coupled to a fourth connection wire, and the third connection wire is coupled to a first input of the integrated circuit and the fourth connection wire is coupled to a second input of the integrated circuit.

* * * * *